(12) United States Patent
Lin et al.

(10) Patent No.: US 10,297,449 B2
(45) Date of Patent: May 21, 2019

(54) METHOD FOR MANUFACTURING THIN FILM TRANSISTOR, METHOD FOR MANUFACTURING ARRAY SUBSTRATE, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zijin Lin, Beijing (CN); Haisheng Zhao, Beijing (CN); Xiaoguang Pei, Beijing (CN); Zhilong Peng, Beijing (CN); Dongjiang Sun, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/328,155

(22) PCT Filed: May 9, 2016

(86) PCT No.: PCT/CN2016/081424
§ 371 (c)(1),
(2) Date: Jan. 23, 2017

(87) PCT Pub. No.: WO2017/133111
PCT Pub. Date: Aug. 10, 2017

(65) Prior Publication Data
US 2018/0331131 A1    Nov. 15, 2018

(30) Foreign Application Priority Data

Feb. 2, 2016  (CN) .......................... 2016 1 0073355

(51) Int. Cl.
*H01L 21/027* (2006.01)
*H01L 27/12* (2006.01)
(Continued)

(52) U.S. Cl.
CPC ........ *H01L 21/0273* (2013.01); *H01L 21/027* (2013.01); *H01L 21/0271* (2013.01);
(Continued)

(58) Field of Classification Search
CPC ........... H01L 21/02118; H01L 21/0273; H01L 21/312; H01L 21/47; H01L 21/027;
(Continued)

(56) References Cited

U.S. PATENT DOCUMENTS 5,895,271 A * 4/1999 Hasegawa ........... H01L 21/0272
                                                            204/192.36
2005/0054146 A1    3/2005 Chen et al.
(Continued)

FOREIGN PATENT DOCUMENTS

CN    101295666 A    10/2008
CN    102800629 A    11/2012
(Continued)

OTHER PUBLICATIONS

International Search Report and Written Opinion for Application No. PCT/CN2016/081424, dated Sep. 27, 2016, 11 Pages.

*Primary Examiner* — Eduardo A Rodela
(74) *Attorney, Agent, or Firm* — Brooks Kushman P.C.

(57) ABSTRACT

A method for manufacturing thin film transistor, a method for manufacturing array substrate, an array substrate and a display device are provided. The method for manufacturing thin film transistor includes forming an intermediate layer on a substrate, patterning the intermediate layer to form an intermediate layer reserved region and an intermediate layer unreserved region, where the intermediate layer unreserved
(Continued)

region corresponds to a pattern of a first structure layer, forming, on the substrate with a pattern of the intermediate layer, a material layer from which the first structure layer is formed, and removing the intermediate layer, and forming the pattern of the first structure layer through a portion of the material layer remaining on the substrate.

16 Claims, 2 Drawing Sheets

(51) Int. Cl.
  *H01L 29/66* (2006.01)
  *H01L 29/786* (2006.01)
  *H01L 21/47* (2006.01)
  *H01L 21/308* (2006.01)

(52) U.S. Cl.
  CPC ...... *H01L 21/0272* (2013.01); *H01L 21/0274* (2013.01); *H01L 21/3086* (2013.01); *H01L 21/47* (2013.01); *H01L 27/1262* (2013.01); *H01L 27/1288* (2013.01); *H01L 29/66742* (2013.01); *H01L 29/786* (2013.01)

(58) Field of Classification Search
  CPC ............. H01L 21/0271; H01L 21/0272; H01L 21/0274; H01L 21/3086; H01L 2224/1147; H01L 2224/11472
  See application file for complete search history.

(56) References Cited

U.S. PATENT DOCUMENTS

| | | | |
|---|---|---|---|
| 2009/0269920 A1* | 10/2009 | Park | H01L 21/0272 438/618 |
| 2011/0229831 A1* | 9/2011 | Kido | G03F 7/2022 430/325 |
| 2017/0221924 A1 | 8/2017 | Su et al. | |
| 2017/0294465 A1 | 10/2017 | Pei et al. | |

FOREIGN PATENT DOCUMENTS

| | | |
|---|---|---|
| CN | 105261556 A | 1/2016 |
| CN | 105529274 A | 4/2016 |

* cited by examiner

METHOD FOR MANUFACTURING THIN FILM TRANSISTOR, METHOD FOR MANUFACTURING ARRAY SUBSTRATE, ARRAY SUBSTRATE AND DISPLAY DEVICE

CROSS-REFERENCE TO RELATED APPLICATIONS

This application is the U.S. national phase of PCT Application No. PCT/CN2016/081424 filed on May 9, 2016, which claims priority to Chinese Patent Application No. 201610073355.2 filed on Feb. 2, 2016, the disclosures of which are incorporated in their entirety by reference herein.

TECHNICAL FIELD

The present disclosure relates to the field of display technology, and in particular to a method for manufacturing a thin film transistor, a method for manufacturing an array substrate, an array substrate and a display device.

BACKGROUND

A method for manufacturing an array substrate in the related art includes forming on a base substrate a pattern of a gate metal layer, a pattern of an active layer, a pattern of a source and drain metal layer, a pattern of a passivation layer and a pattern of a transparent conductive layer in order, and each pattern of the above layers is manufactured through such steps as depositing and coating a photoresist, exposing, developing, etching and removing the photoresist and the like.

In a manufacturing process, foreign matters such as dust and chippings are inescapably attached onto the film layers due to the environment, device and other abnormal factors. Theses foreign matters may be attached during the depositing process, the photoresist coating process or the dry etching process. When etching the active layer by the dry etching process, an etching gas may not contact the active layer and react with the same due to the foreign matters attached thereon, and then the portions of the active layer attached with the foreign matters may be remained. As a result, light spots may occur, and the yield of the array substrate may be affected adversely.

SUMMARY

An object of the present disclosure is to provide a method for manufacturing a thin film transistor, a method for manufacturing an array substrate, an array substrate and a display device, so as to avoid the residual film layer and improve the yield of the array substrate.

To achieve the above object, the present disclosure provides the following solutions.

A method for manufacturing a thin film transistor is provided, including: forming an intermediate layer on a substrate; patterning the intermediate layer to form an intermediate layer reserved region and an intermediate layer unreserved region, where the intermediate layer unreserved region corresponds to a pattern of a first structure layer; forming, on the substrate with a pattern of the intermediate layer, a material layer from which the first structure layer is formed; and removing the intermediate layer, and forming the pattern of the first structure layer through a portion of the material layer remaining on the substrate.

Optionally, the intermediate layer reserved region has a surface with a concave-convex structure.

Optionally, a height difference between a convex portion and a concave portion of the concave-convex structure is larger than a thickness of the first structure layer.

Optionally, a material of the intermediate layer includes a photoresist.

Optionally, the first structure layer is an active layer.

Optionally, the intermediate layer is a positive photoresist, and the step of forming the intermediate layer reserved region with the concave-convex structure includes: exposing the intermediate layer by a grey tone mask plate including an opaque region, a semi-transparent region and a transparent region; and forming, after a developing process, a first portion of the intermediate layer reserved region corresponding to the opaque region, a second portion of the intermediate layer reserved region corresponding to the semi-transparent region and the intermediate layer unreserved region corresponding to the transparent region. A thickness of the first portion is larger than a thickness of the second portion.

Optionally, the intermediate layer is a negative photoresist, and the step of forming the intermediate layer reserved region with the concave-convex structure includes: exposing the intermediate layer by a grey tone mask plate including an opaque region, a semi-transparent region and a transparent region; and forming, after a developing process, a first portion of the intermediate layer reserved region corresponding to the transparent region, a second portion of the intermediate layer reserved region corresponding to the semi-transparent region and the intermediate layer unreserved region corresponding to the opaque region. A thickness of the first portion is larger than a thickness of the second portion.

Optionally, the step of removing the intermediate layer includes: applying a stripping liquid onto an exposed portion of the intermediate layer, and removing the intermediate layer from the substrate through a chemical reaction between the stripping liquid and the intermediate layer.

Optionally, the step of removing the intermediate layer, and forming the pattern of the first structure layer through a portion of the material layer remaining on the substrate includes: coating a photoresist onto the material layer; exposing the photoresist using a mask plate, and forming, after a developing process, a photoresist reserved region and a photoresist unreserved region, where the photoresist reserved region correspond to the pattern of the first structure layer; removing the material layer corresponding to the photoresist unreserved region by a dry etching process; and applying a stripping liquid onto an exposed portion of the intermediate layer, and removing the intermediate layer from the substrate through a chemical reaction between the stripping liquid and the intermediate layer.

Optionally, a material of the intermediate layer includes a photoresist.

Optionally, the first structure layer is an active layer.

Optionally, the intermediate layer is a positive photoresist, and the step of forming the intermediate layer reserved region with the concave-convex structure includes: exposing the intermediate layer by a grey tone mask plate including an opaque region, a semi-transparent region and a transparent region; and forming, after a developing process, a first portion of the intermediate layer reserved region corresponding to the opaque region, a second portion of the intermediate layer reserved region corresponding to the semi-transparent region and the intermediate layer unreserved region corresponding to the transparent region. A thickness of the first portion is larger than a thickness of the second portion.

Optionally, the intermediate layer is a negative photoresist, and the step of forming the intermediate layer reserved region with the concave-convex structure includes: exposing the intermediate layer by a grey tone mask plate including an opaque region, a semi-transparent region and a transparent region; and forming, after a developing, a first portion of the intermediate layer reserved region corresponding to the transparent region, a second portion of the intermediate layer reserved region corresponding to the semi-transparent region and the intermediate layer unreserved region corresponding to the opaque region. A thickness of the first portion is larger than a thickness of the second portion.

Optionally, the step of removing the intermediate layer includes: applying a stripping liquid onto an exposed portion of the intermediate layer, and removing the intermediate layer from the substrate through a chemical reaction between the stripping liquid and the intermediate layer.

Optionally, a material of the material layer includes a-Si and N+a-Si.

Optionally, prior to forming an intermediate layer on a substrate, the method further includes: providing a base substrate; forming a pattern of a gate metal layer on the substrate; and depositing a gate insulating layer onto the base substrate provided with the pattern of the gate metal layer.

A method for manufacturing an array substrate is provided, including forming a thin film transistor on a substrate by the method hereinabove.

An array substrate is provided, including a thin film transistor formed on a substrate by the method hereinabove.

A display device is provided, including the array substrate hereinabove.

According to the present disclosure, a pattern of an intermediate layer is formed on a substrate. The pattern of the intermediate layer includes an intermediate layer reserved region and an intermediate layer unreserved region. The intermediate layer unreserved region corresponds to a pattern of an active layer. A material of the active layer is deposited onto the substrate with the pattern of the intermediate layer. Therefore, the pattern of the active layer may be formed after the intermediate layer is removed. According to the present disclosure, the pattern of the active layer is formed by removing the intermediate layer rather than etching the material of the active layer by a dry etching process, therefore the residue of the active layer film may be avoided even though there are foreign matters attached on the material of the active layer, thereby improving the yield of the array substrate.

DRAWING REFERENCES

Figure 1:
FIG. 1 is a schematic view of a base substrate with a pattern of a gate metal layer arranged thereon in some embodiments of the present disclosure.

1: base substrate; 2: gate metal layer; 3: gate insulating layer; 4: active layer; 10: photoresist

DETAILED DESCRIPTION

In order to make the objects, the technical solutions and the advantages of the present disclosure more apparent, the present disclosure will be described hereinafter in details in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the related art, an a-Si layer and an N+a-Si layer are deposited in order onto an gate insulating layer (which may be made of SiNx) while forming a pattern of an active layer. Then, a photoresist is coated onto the N+a-Si layer. After an exposing process and a developing process, the photoresist above a region of the active layer pattern is remained, and the photoresist above the other regions is removed. Then, the a-Si layer and the N+a-Si layer which are not protected by the photoresist are removed by a dry etching process. At last, the remained photoresist is removed by a liquid reaction, so as to form the pattern of the active layer. In a manufacturing process, foreign matters such as dust and chippings are inescapably attached onto the film layers due to the environment, device and other abnormal factors. Theses foreign matters may be attached during the depositing process, the photoresist coating process or the dry etching process. When etching the active layer by the dry etching process, an etching gas may not contact the active layer and react with the same due to the foreign matters attached thereon, and then the portions of the active layer attached with the foreign matters may be remained. As a result, light spots may occur, and the yield of the array substrate may be affected adversely.

A method for manufacturing a thin film transistor, a method for manufacturing array substrate, an array substrate and a display device are provided in some embodiments of the present disclosure, to solve the issues in the related art that the residue of the active layer film results in light spots and adversely affects the yield of the array substrate, so as to avoid the residue of the film layer and improve the yield of the array substrate.

A method for manufacturing a thin film transistor is provided in some embodiments of the present disclosure, including: forming an intermediate layer on a substrate; patterning the intermediate layer to form an intermediate layer reserved region and an intermediate layer unreserved region, where the intermediate layer unreserved region corresponds to a pattern of a first structure layer and the intermediate layer reserved region has a surface with a concave-convex structure; forming, on the substrate with a pattern of the intermediate layer, a material layer from which the first structure layer is formed; and removing the intermediate layer, and forming the pattern of the first structure layer through a portion of the material layer remaining on the substrate.

According to the embodiments of the present disclosure, a pattern of an intermediate layer is formed on a substrate. The pattern of the intermediate layer includes an intermediate layer reserved region and an intermediate layer unreserved region. The intermediate layer unreserved region corresponds to a pattern of an active layer. A material of the active layer is deposited onto the substrate with the pattern of the intermediate layer. Therefore, the pattern of the active layer may be formed after the intermediate layer is removed. According to the embodiments of the present disclosure, the pattern of the active layer is formed by removing the intermediate layer rather than etching the material of the active layer by a dry etching process, therefore the residue of the active layer film may be avoided even though foreign matters are attached on the material of the active layer, thereby improving the yield of the array substrate.

In some embodiments of the present disclosure, the intermediate layer may be made of a photoresist.

In some embodiments of the present disclosure, the first structure layer may be but not limited to an active layer. In the case that the first structure layer is an active layer, the residue of the active layer film may be avoided and the yield of the array substrate may be improved effectively.

Optionally, the intermediate layer is a positive photoresist, and the step of forming the intermediate layer reserved region with the concave-convex structure includes: exposing the intermediate layer by a grey tone mask plate including an opaque region, a semi-transparent region and a transparent region; and forming, after a developing process, a first portion of the intermediate layer reserved region corresponding to the opaque region, a second portion of the intermediate layer reserved region corresponding to the semi-transparent region and the intermediate layer unreserved region corresponding to the transparent region. Here, a thickness of the first portion is larger than a thickness of the second portion.

Optionally, the intermediate layer is a negative photoresist, and the step of forming the intermediate layer reserved region with the concave-convex structure includes: exposing the intermediate layer by a grey tone mask plate including an opaque region, a semi-transparent region and a transparent region; and forming, after a developing process, a first portion of the intermediate layer reserved region corresponding to the transparent region, a second portion of the intermediate layer reserved region corresponding to the semi-transparent region and the intermediate layer unreserved region corresponding to the opaque region. Here, a thickness of the first portion is larger than a thickness of the second portion.

Optionally, the step of removing the intermediate layer includes: applying a stripping liquid onto an exposed portion of the intermediate layer, and removing the intermediate layer from the substrate through a chemical reaction between the stripping liquid and the intermediate layer.

Optionally, the step of removing the intermediate layer, and forming the pattern of the first structure layer through a portion of the material layer remaining on the substrate, includes: coating a photoresist onto the material layer; exposing the photoresist using a mask plate, and forming, after a developing process, a photoresist reserved region and a photoresist unreserved region, where the photoresist reserved region correspond to the pattern of the first structure layer; removing the material layer corresponding to the photoresist unreserved region by a dry etching process; and applying a stripping liquid onto an exposed portion of the intermediate layer, and removing the intermediate layer from the substrate through a chemical reaction between the stripping liquid and the intermediate layer.

Accordingly, even though the residue of the active layer film occurs due to the foreign matters at the photoresist unreserved region, the residue of the active layer film may be guaranteed to be peeled off in the subsequent process of removing the intermediate layer. According to the method hereinabove, it is not required to form an intermediate layer reserved region having a concave-convex surface, thereby simplifying the manufacturing process.

In some embodiments of the present disclosure, the material layer may be made of a-Si layer and N+a-Si.

A method for manufacturing an array substrate is provided in some embodiments of the present disclosure, including forming a thin film transistor on a substrate by the method hereinabove.

According to the embodiments of the present disclosure, a pattern of an intermediate layer is formed on a substrate. The pattern of the intermediate layer includes an intermediate layer reserved region and an intermediate layer unreserved region. The intermediate layer unreserved region corresponds to a pattern of an active layer. A material of the active layer is deposited onto the substrate with the pattern of the intermediate layer. Therefore, the pattern of the active layer may be formed after the intermediate layer is removed. According to the embodiments of the present disclosure, the pattern of the active layer is formed by removing the intermediate layer rather than etching the material of the active layer by a dry etching process, therefore the residue of the active layer film may be avoided even though foreign matters are attached on the material of the active layer, thereby improving the yield of the array substrate.

An array substrate is provided in some embodiments, including a thin film transistor formed on a substrate by the method hereinabove. According to the array substrate provided, the residue of the active layer film may not occur and the yield of the array substrate may be improved effectively.

A display device is provided in some embodiments, including the array substrate hereinabove. The display device may be any product or component with a display function, such as a liquid crystal television, a liquid crystal display, a digital photo frame, a cell phone and a tablet PC.

The display device may include a flexible circuit board, a printed circuit board and a back plate.

A method for manufacturing an array substrate is provided in some embodiments of the present disclosure, so as to avoid the light spots due to the residue of the active layer film. The method includes Steps 1-5 in the following.

Figure 2:
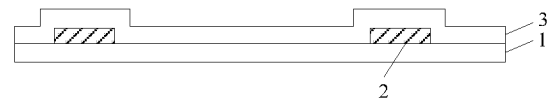
FIG. 2 is a schematic view where a gate insulating layer is formed in some embodiments of the present disclosure.
Figure 3:
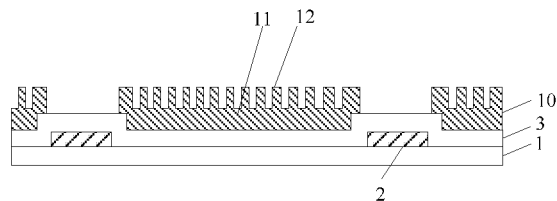
FIG. 3 is a schematic view where a photoresist is formed in some embodiments of the present disclosure.
Figure 4:
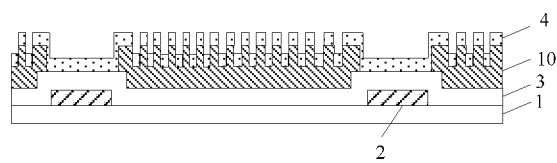
FIG. 4 is a schematic view where an active layer is deposited on the photoresist in some embodiments of the present disclosure.

Step 1: providing a base substrate 1 and forming a pattern of a gate metal layer 2 on the base substrate 1, as shown in FIG. 1;

Step 2: depositing a gate insulating layer 3 on the resultant base substrate 1 in Step 1, to avoid a short circuiting of the gate metal layer 2, as shown in FIG. 2;

Step 3: coating a photoresist 10 on the resultant base substrate 1 in Step 2 and exposing the photoresist 10 by a grey tone mask plate, and forming, after a developing process, a photoresist unreserved region corresponding to a pattern of an active layer and a photoresist reserved region corresponding to the other regions, where the photoresist reserved region includes a first portion 11 and a second portion 12, and the first portion 11 and the second portion 12 have different thicknesses, so as to form a pit-like photoresist reserved region, i.e., the photoresist reserved region has an uneven surface, as shown in FIG. 3;

Step 4: depositing an active layer 4 on the resultant base substrate 1 in Step 3, as shown in FIG. 4. The active layer 4 includes an a-Si layer and an N+a-Si layer. There is no photoresist at the photoresist unreserved region, so the deposited active layer 4 may be in direct contact with the gate insulating layer 3. The active layer at the other regions is deposited onto the photoresist 10. The photoresist reserved region has the surface with the concave-convex structure, and a height different between a top and a bottom of the concave-convex structure is larger than a thickness of the active layer 4, so the film of the active layer 4 may be in a disconnected state i.e., loss of continuity, during the depositing of the active layer 4. And then some photoresist covered by the active layer 4 may be exposed, thereby the stripping liquid may by in contact with the photoresist and reacts with the same in the subsequent removing process;

Step 5: applying a stripping liquid onto the photoresist 10 to remove the photoresist 10. According to the embodiments of the present disclosure, the active layer 4 is deposited on the photoresist 10, so there is no need to etch the deposited active layer 4 by a dry etching process. After removing the photoresist 10, the active layer 4 at the photoresist reserved region may be removed correspondingly, and then the pattern of the active layer 4 is formed.

According to the embodiments of the present disclosure, a layer of photoresist is coated on the gate insulating layer, the photoresist at the region of the active layer pattern is removed, the photoresist at the other regions is formed to have a concave-convex surface, and then the active layer is deposited. Since the photoresist has a concave-convex surface, during the depositing of the active layer, parts of the active layer may be disconnected at interfaces of an upper portion and a lower portion of the photoresist, such that the photoresist under the active layer may be exposed. The photoresist is removed through a chemical reaction between the stripping liquid and the photoresist, and then the active layer deposited on the photoresist is removed, while the active layer deposited on the photoresist unreserved region is not removed, so as to form the pattern of the active layer. According to the embodiments of the present disclosure, the pattern of the active layer is formed by removing the intermediate layer rather than etching the material of the active layer by a dry etching process. Therefore the residue of the active layer film may be avoided even though foreign matters are attached on the material of the active layer, thereby improving the yield of the array substrate.

In some embodiments of the present disclosure, a method for manufacturing an array substrate is provided in some embodiments of the present disclosure, so as to avoid the light spots due to the residue of the active layer film. The method includes Steps 1-9 in the following.

Figure 5:
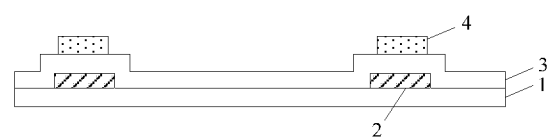
FIG. 5 is a schematic view where a photoresist is removed and a pattern of an active layer is formed in some embodiments of the present disclosure.
Figure 6:
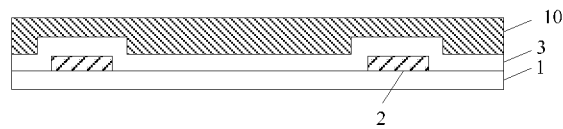
FIG. 6 is a schematic view where a photoresist is coated on a gate insulating layer in some embodiments of the present disclosure.
Figure 7:
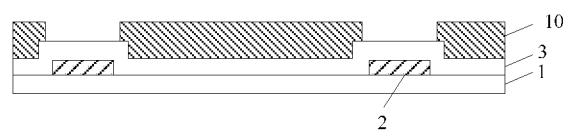
FIG. 7 is a schematic view where a photoresist is etched in some embodiments of the present disclosure.
Figure 8:
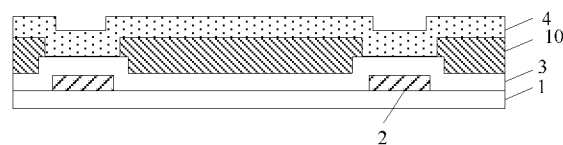
FIG. 8 is a schematic view where an active layer is deposited on a photoresist in some embodiments of the present disclosure.
Figure 9:
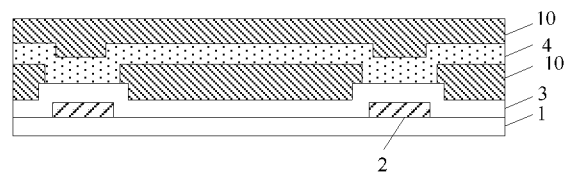
FIG. 9 is a schematic view where a photoresist is coated on the active layer in some embodiments of the present disclosure.
Figure 10:
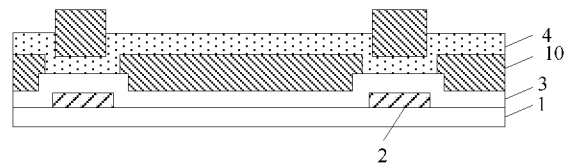
FIG. 10 is a schematic view where a photoresist coated on the active layer is etched in some embodiments of the present disclosure.
Figure 11:
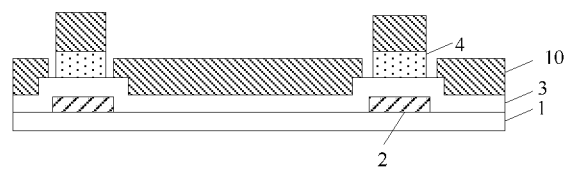
FIG. 11 is a schematic view where an active layer is etched in some embodiments of the present disclosure.

Step 1: providing a base substrate 1 and forming a pattern of a gate metal layer 2 on the base substrate 1, as shown in FIG. 1;

Step 2: depositing a gate insulating layer 3 on the resultant base substrate 1 in Step 1, to avoid a short circuiting of the gate metal layer 2, as shown in FIG. 2;

Step 3: coating a photoresist 10 on the resultant base substrate 1 in Step 2, as shown in FIG. 6;

Step 4: exposing the photoresist 10, and forming, after a developing process, a photoresist unreserved region corresponding to a pattern of an active layer and a photoresist reserved region corresponding to the other regions, as shown in FIG. 7;

Step 5: depositing an active layer 4 on the resultant base substrate 1 in Step 4, as shown in FIG. 8, where the active layer 4 includes an a-Si layer and an N+a-Si layer. There is no photoresist at the photoresist unreserved region, so the active layer 4 deposited at the photoresist unreserved region may be in direct contact with the gate insulating layer 3;

Step 6: depositing a photoresist 10 on the resultant base substrate 1 in Step 5, as shown in FIG. 9;

Step 7: exposing the photoresist 10, and forming, after a developing process, a photoresist reserved region corresponding to the pattern of the active layer and a photoresist unreserved region corresponding to the other regions, as shown in FIG. 10;

Step 8: removing the active layer 4 at the photoresist unreserved region by a dry etching process, to form a pattern of the active layer 4, as shown in FIG. 11;

Step 9: applying a stripping liquid onto the photoresist 10 to remove the photoresist 10, as shown in FIG. 5.

Accordingly, even though the residue of the active layer film occurs due to the foreign matters at the other region, the residue of the active layer film may be guaranteed to be peeled off in the subsequent process of removing the intermediate layer since the active layer is formed on the photoresist. According to the method hereinabove, it is not required to form an intermediate layer reserved region having a concave-convex surface, thereby simplifying the manufacturing process.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A method for manufacturing a thin film transistor, comprising:
   forming an intermediate layer on a substrate;
   patterning the intermediate layer to form an intermediate layer reserved region and an intermediate layer unreserved region, wherein the intermediate layer unreserved region corresponds to a pattern of a first structure layer;
   forming, on the substrate with a pattern of the intermediate layer, a material layer from which the first structure layer is formed; and removing the intermediate layer, and forming the pattern of the first structure layer through a portion of the material layer remaining on the substrate, wherein the intermediate layer reserved region has a surface with a concave-convex structure, and a material of the intermediate layer comprises a photoresist.

2. The method according to claim 1, wherein a height difference between a convex portion and a concave portion of the concave-convex structure is larger than a thickness of the first structure layer.

3. The method according to claim 1, wherein the first structure layer is an active layer.

4. The method according to claim 3, wherein the intermediate layer is a positive photoresist, and the step of forming the intermediate layer reserved region comprises:

exposing the intermediate layer by a grey tone mask plate comprising an opaque region, a semi-transparent region and a transparent region; and forming, after a developing process, a first portion of the intermediate layer reserved region corresponding to the opaque region, a second portion of the intermediate layer reserved region corresponding to the semi-transparent region and the intermediate layer unreserved region corresponding to the transparent region, wherein a thickness of the first portion is larger than a thickness of the second portion.

5. The method according to claim 3, wherein the intermediate layer is a negative photoresist, and the step of forming the intermediate layer reserved region comprises:

exposing the intermediate layer by a grey tone mask plate comprising an opaque region, a semi-transparent region and a transparent region; and forming, after a developing process, a first portion of the intermediate layer reserved region corresponding to the transparent region, a second portion of the intermediate layer reserved region corresponding to the semi-transparent region and the intermediate layer unreserved region corresponding to the opaque region, wherein a thickness of the first portion is larger than a thickness of the second portion.

6. The method according to claim 3, wherein the step of removing the intermediate layer comprises:

applying a stripping liquid onto an exposed portion of the intermediate layer, and removing the intermediate layer from the substrate through a chemical reaction between the stripping liquid and the intermediate layer.

7. The method according to claim 1, wherein a material of the material layer comprises a-Si and N+a-Si.

8. The method according to claim 1, wherein prior to forming an intermediate layer on a substrate, the method further comprises:

providing a base substrate;

forming a pattern of a gate metal layer on the substrate; and depositing a gate insulating layer onto the base substrate provided with the pattern of the gate metal layer.

9. A method for manufacturing an array substrate, comprising forming a thin film transistor on a substrate by the method according to claim 1.

10. An array substrate, comprising a thin film transistor formed on a substrate by the method according to claim 1.

11. A display device, comprising the array substrate according to claim 10.

12. The method according to claim 1, wherein prior to forming an intermediate layer on a substrate, the method further comprises:

providing a base substrate;

forming a pattern of a gate metal layer on the substrate; and depositing a gate insulating layer onto the base substrate provided with the pattern of the gate metal layer.

13. A method for manufacturing a thin film transistor, comprising:

providing a substrate;

forming a pattern of a gate metal layer on the substrate;

depositing a gate insulating layer onto the substrate provided with the pattern of the gate metal layer;

coating a first intermediate layer on the substrate;

exposing the first intermediate layer and forming, after a developing process, a first intermediate layer unreserved region corresponding to a pattern of a first structure layer and a first intermediate layer reserved region corresponding to other regions;

depositing the first structure layer on the substrate;

depositing a second intermediate layer on the substrate;

exposing the second intermediate layer, and forming, after a developing process, a second intermediate layer reserved region corresponding to the pattern of the first structure and a second intermediate layer unreserved region corresponding to the other regions;

removing the first structure layer at the second intermediate layer unreserved region by a dry etching process, to form a pattern of the first structure layer; and applying a stripping liquid onto the second intermediate layer to remove the first intermediate layer and the second intermediate layer, wherein the intermediate layer reserved region has a surface with a concave-convex structure, and each of a material of the first intermediate layer and a material of the second intermediate layer comprises a photoresist.

14. The method according to claim 13, wherein the first structure layer is an active layer.

15. The method according to claim 14, wherein the intermediate layer is a positive photoresist, and the step of forming the intermediate layer reserved region comprises:

exposing the intermediate layer by a grey tone mask plate comprising an opaque region, a semi-transparent region and a transparent region; and forming, after a developing process, a first portion of the intermediate layer reserved region corresponding to the opaque region, a second portion of the intermediate layer reserved region corresponding to the semi-transparent region and the intermediate layer unreserved region corresponding to the transparent region, wherein a thickness of the first portion is larger than a thickness of the second portion.

16. The method according to claim 14, wherein the intermediate layer is a negative photoresist, and the step of forming the intermediate layer reserved region comprises:

exposing the intermediate layer by a grey tone mask plate comprising an opaque region, a semi-transparent region and a transparent region; and forming, after a developing, a first portion of the intermediate layer reserved region corresponding to the transparent region, a second portion of the intermediate layer reserved region corresponding to the semi-transparent region and the intermediate layer unreserved region corresponding to the opaque region, wherein a thickness of the first portion is larger than a thickness of the second portion.

* * * * *